United States Patent [19]
Bailey et al.

[11] 3,952,291
[45] Apr. 20, 1976

[54] READOUT SYSTEM FOR MAGNETIC BUBBLES

[75] Inventors: Paul T. Bailey, Creve Coeur; Robert M. Sandfort, St. Charles, both of Mo.; Howard H. Aiken, deceased, late of Fort Lauderdale, Fla., by Mary E. Aiken, executrix

[73] Assignee: Monsanto Company, St. Louis, Mo.

[22] Filed: Sept. 28, 1973

[21] Appl. No.: 401,893

[52] U.S. Cl. .................. 340/174 TF; 340/174 SR; 340/174 CA; 340/174 EB
[51] Int. Cl.$^2$ .................. G11C 11/14; G11C 19/08
[58] Field of Search .................. 340/174 TF, 174 SR

[56] References Cited
UNITED STATES PATENTS

| | | | |
|---|---|---|---|
| 3,543,255 | 11/1970 | Morrow et al. | 340/174 TF |
| 3,646,530 | 2/1972 | Chow | 340/174 TF |
| 3,680,066 | 7/1972 | Copeland | 340/174 TF |
| 3,696,347 | 10/1972 | Copeland | 340/174 TF |
| 3,735,145 | 5/1973 | Heinz | 340/174 TF |
| 3,820,089 | 6/1974 | Lama | 340/174 EB |

OTHER PUBLICATIONS
IBM Tech. Disc. Bull. "Magnetic Bubble Sensing" by Bailot et al.; Vol. 13; No. 10 3/71; pp. 3100, 3101.

IBM Tech. Disc. Bull. "Passive Magnetic Domain Amplification" by Bosch et al.; Vol. 13; No. 9; 2/71; p. 2739.

*Primary Examiner*—Stanley M. Urynowicz, Jr.
*Attorney, Agent, or Firm*—Lane, Aitken, Dunner & Ziems

[57] ABSTRACT

A technique for enhancing readout of magnetic bubble data by producing two separate, complementary multiplicities of bubbles representing respectively the presences and the absences of bubbles in a data stream. A pair of detectors register the presence of the respective multiplicities of bubbles. The outputs of the detectors are compared to produce a single output indicative of the presence or absence of the original data bubble. In one embodiment a bubble logic gate causes a single bubble bit in the data stream to logically influence a train of bubbles in a separate closed circuit operating at a rate which is a multiple of the rate of the data stream. Depending on the presence or absence of a bubble in the data stream, the train of bubbles is directed to one or the other of a pair of magnetoresistive elements spanning the length of the train of bubbles. The magnetoresistive elements form part of a balanced bridge circuit.

30 Claims, 6 Drawing Figures

READOUT SYSTEM FOR MAGNETIC BUBBLES

BACKGROUND OF THE INVENTION

The invention relates generally to the field of magnetic bubble technology (MBT) and more particularly to arrangements for improving the quality of readout in data processing systems utilizing the capabilities of single-walled magnetic domain devices.

The continuing evolution of MBT has now reached the point where large-scale application to various data processing tasks is practicable. Current interest in MBT is due primarily to the prospect of extremely high bit-packing density, low power consumption and reliability for low-cost mass memories where the speed of access is secondary to capacity or nonvolatility at a reasonable size and cost per bit.

Briefly, MBT involves the creation, propagation and logical manipulation of single-walled magnetic domains in specially prepared magnetic materials. The application of a static uniform magnetic bias field orthagonal to a sheet of magnetic material having suitable uniaxial anisotropy causes the normally random pattern of magnetic domains to shrink into short cylindrical configurations called bubbles whose common polarity is opposite that of the bias field. The bubbles repel each other and can be moved or propagated by a magnetic field in the plane of the sheet. The term bubble used herein is intended to encompass any single-walled magnetic domain, i.e., any domain having a boundary which closes on itself.

Many schemes now exist for propagating bubbles along predetermined channels. One propagation system includes permalloy circuit elements shaped like military service stripes or "chevrons" spaced end-to-end in a thin layer over a sheet of magnetic material. The magnetic drive field is continuously rotating in the plane of the sheet. This propagation system is termed "field-accessed" as distinguished from other systems employing loops of electrical conductors disposed on the sheet. The operation of both types of propagation systems is described in the existing literature on MBT.

The use of MBT in data processing stems from the fact that magnetic bubbles can be propagated through channels at a precisely determined rate enabling the creation of uniform streams of bubbles in which the presence or absence of a bubble indicates a binary "1" or "0" at a corresponding bit position within the stream. The use of MBT for performing logic operations is based on the fact that closely adjacent magnetic bubbles tend to repel each other. Thus, if alternate paths with varying degrees of preference are built into a bubble circuit, the direction which a bubble on one channel ultimately takes can be influenced by the presence or absence of a bubble on another nearby channel. Several types of logic circuits are discussed in the copending application Ser. No. 283,267, R. C. Minnick et al, filed Aug. 24, 1972, entitled "Magnetic Bubble Logic Family," assigned to the assignee of the present application. A substantial portion of the disclosure in this copending application has been published in the Proceedings of the Sept. 19, 1972, Wescon Conference in a paper entitled "Magnetic Bubble Logic" by R. C. Minnick et al. These disclosures are incorporated in full by reference into this application.

One of the most difficult problems facing practical implementation of MBT is readout. Despite efforts to minimize readout by incorporating logic in the memory to enhance the informational content of each bit, a reliable readout is still, of course, necessary at some point to utilize the information carried by the bubble bits. In the past, optical devices utilizing the Faraday or Kerr effect and magnetoresistive or magnetoconductive devices, for example, employing the Hall effect, have been used as well as simple conductor loops. The basic problem, however, is that the small magnetic field associated with a single miniscule magnetic bubble propagating along a channel is barely distinguishable from the background noise which, by itself, represents the absence of a bubble; and therefore extremely sensitive detectors, entailing such problems as matching, reliability and cost, must be used to effect readout. While detection can be improved by expanding the size of an individual bubble with known devices referred to in the literature as "bubble-stretchers," the physical limitations of this technique have restricted its success.

SUMMARY OF THE INVENTION

The general purpose of the invention is to improve readout for magnetic bubble systems. A related objective of the invention is to generate separate, complementary multiplicities of bubbles representing respectively the presences and absences of bubbles in a data stream of bubbles. Another object of the invention is to operate a plurality of interacting propagation systems at different rates.

The applicants have discovered that these and other objects of the invention are accomplished by a readout system in which two separate, complementary multiplicities of magnetic bubbles are produced, representing respectively, the presences and absences of bubbles in a data bubble stream and a pair of detectors is used to register the presence of the respective multiplicities of bubbles. The outputs of the detectors are compared to produce a single output indicative of the presence or absence of the original data bubble.

In addition, a system for operating two separate, but interacting bubble channels at different frequencies is described herein. The multi-frequency system is not necessarily restricted to readout systms, but is disclosed herein as a part of the specific readout system described in detail. Moreover, systems of general application are described in connection with the readout system for automatically switching bubbles to a given track of a particular type of "two-rail" logic system described below.

In one embodiment of the readout system, a bubble logic gate causes the presence or absence of s single bubble in the data stream to logically influence a train or series of bubbles in a separate, closed, readout circuit operating at a frequency in excess of the rate of the data stream. Depending on the presence or absence of a bubble in the data stream, the train of bubbles is directed to one or the other of a pair of magnetoresistive elements (bubble detectors) spanning the length of the train of bubbles. The magnetoresistive elements form part of a balanced bridge circuit. In particular, a Wheatstone-type bridge is used in which two of the diagonal resistance arms of the bridge are composed of the magnetoresistors which react to the presence or absence of bubbles. The output of the bridge is connected to a differential amplifier. The polarity of the amplifier output corresponds to the presence or absence of a data bubble, respectively.

The higher frequency circuit in this embodiment is composed of a two-rail propagation circuit in the form of a closed loop. This propagation circuit includes a ring-shaped rail of magnetically soft material crisscrossed by a "serpentine" electrical conductor in consecutive, uniform open loops defining consecutive stable positions for bubbles along the rail on opposite complementary sides thereof.

The propagation rate along the double rail circuit is controlled by alternating electrical pulses applied to the serpentine conductor. The data stream, on the other hand, is conveyed by a field-accessed circuit composed of individual, magnetically soft circuit elements. The two propagation systems are arranged so that the field-accessed circuit comes close enough to the conductor-driven circuit at one point that the presence of a bubble on the field-accessed circuit causes bubbles on the conductor-driven circuit to move from one side to the other side of the rail. Because the conductor circuit is driven at a higher frequency than the field-accessed circuit, a single bubble on the field-accessed circuit influences a plurality of bubbles on the conductor-driven circuit to change "state," that is, to move from the outer to the inner side of the rail. Magnetoresistive elements are located adjacent to opposite sides of the rail downstream of the point where the field-accessed circuit influences the conductor circuit. Further downstream from the bubble detectors, a "reset" circuit causes all of the bubbles to be placed to one side of the rail. In one embodiment of the "reset" circuit the rail is offset over a plurality of bubble positions toward one side of the serpentine conductor, thus forcing the bubbles to the other side of the rail. In another embodiment, the reset circuit comprises an offset discontinuity in the magnetic rail, forcing bubbles to one side of the rail.

DESCRIPTION OF THE PREFERRED EMBODIMENTS

Figure 1:
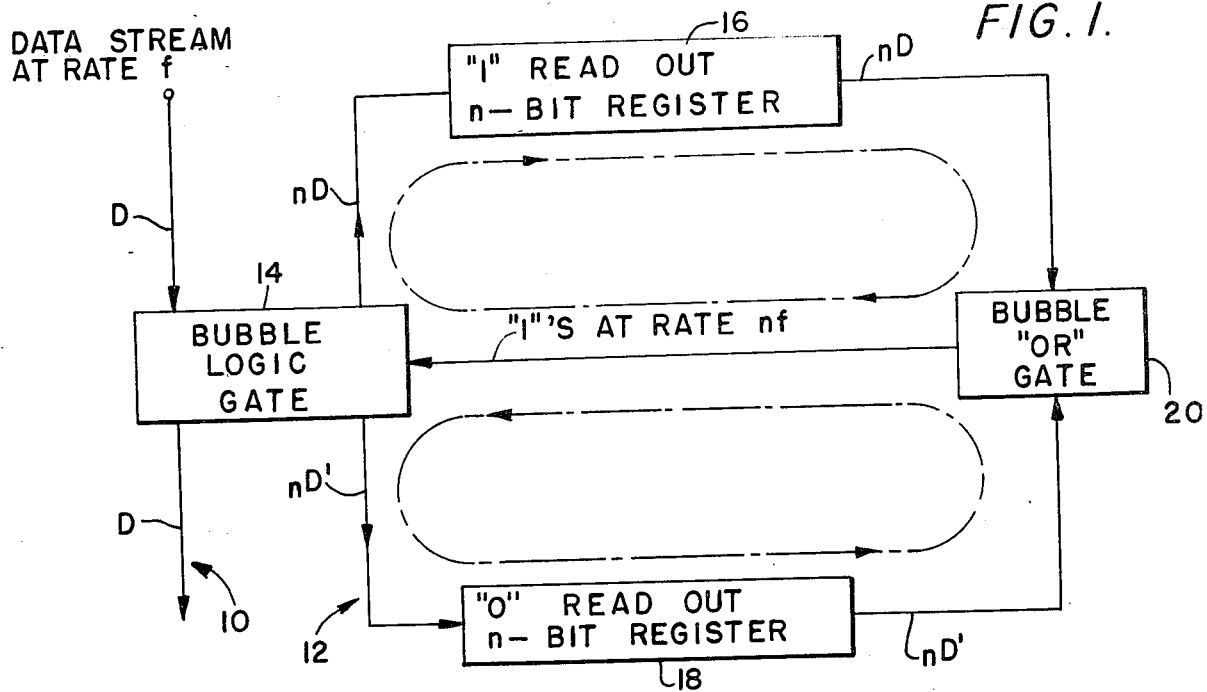
FIG. 1 is a block diagram of the readout system according to the invention.

In the general system shown in FIG. 1, a data stream D of magnetic bubbles operating at the frequency f in a propagation system 10 is arranged to influence a separate propagation system 12 operating at a higher frequency, $nf$, via a magnetic bubble logic gate or interactor 14. The logic gate 14 has two inputs: the data stream D at rate $f$, and a continuous stream of bubbles ("1"s) at rate $nf$. The data stream D is made up of bubble bit positions whose vacancy indicates a binary "0" and whose occupation by a bubble represents a binary "1." The logic gate 14 has three outputs. One of the outputs is the data stream D, or an identical replica thereof. The other two outputs are complementary. One of the outputs, $nD$, is passed to a "1" readout, $n$-bit register 16. This output represents a multiplied replica of the data stream D. That is, for each bubble bit in the data stream, a train of n corresponding bubble bits is passed to the register 16. The other output of the logic gate 14, $nD'$, is passed to a "0" readout, $n$-bit register 18. For each bubble bit in the data stream D, the output to register 18 is a train of $n$ consecutive bubble bits, each of which is the complement of the data bit. For example, if the bubble bit entering the logic gate 14 from the data stream D is a "1," that is, a bubble, $n$ consecutive bubbles are passed to the register 16 and no bubbles are passed to the register 18. On the other hand, if the data bit is "0," that is, the absence of a bubble, $n$ consecutive bubbles are passed to the "0" register 18, and no bubbles are passed to the "1" register 16.

The bubble logic gate 14 represents a "specialized" version of several of the classes of logic gates described in the Wescon publication and copending application cited above. In particular, the general classes of logic gates, 21, 25, 28, and 29, described in these disclosures, are suitable if the input to the top track is made "0," that is, eliminated, and the input to the middle track is always "1," corresponding to a full stream of bubbles, and the input to the bottom track is the data stream D.

The registers 16 and 18 are implemented by bubble detectors of any suitable type, such as magnetoresistive elements responsive to the outputs $nD$ and $nD'$ respectively. The registers 16 and 18 do not, however, interfere logically with the passing bubble trains and therefore their outputs are respectively $nD$ and $nD'$. Because these outputs are complementary, their sum is a full stream of bubbles. Thus, the outputs of the registers 16 and 18 are passed to a conventional magnetic bubble "OR" gate 20, which composes the full stream of bubbles which represents the "1" input at rate $nf$ to the logic gate 14. Accordingly, the complementary circuits associated with the registers 16 and 18 continuously recirculate, as indicated schematically by the dash-dot loops in the FIG. 1.

Because of this arrangement, a signal n times larger than that which would be produced from a bubble ("1") datum in the data stream D is obtained from the $n$ bubbles in the register 16. Moreover, an equally large signal is obtained from the complement register 18 if the original bit in data stream D was the absence of a bubble ("0"). As a result, the absence of a magnetic bubble is detected not as mere background noise, but as a signal of equal strength to that obtained in the presence of a magnetic bubble. The signals from the two registers 16 and 18 can be easily differentiated by giving them opposite polarities. Thus, the signal is not only multiplied by the frequency ratio between the propagation rates of the circuits 12 and 10 in FIG. 1, but also the difference between the "0" and "1" signal or probability of detection, that is, the ability to distinguish between "0" and "1" bits, is effectively doubled. In addition, since no bubble generators, splitters or annihilators are used, bubbles are conserved in the readout network.

Figure 2:
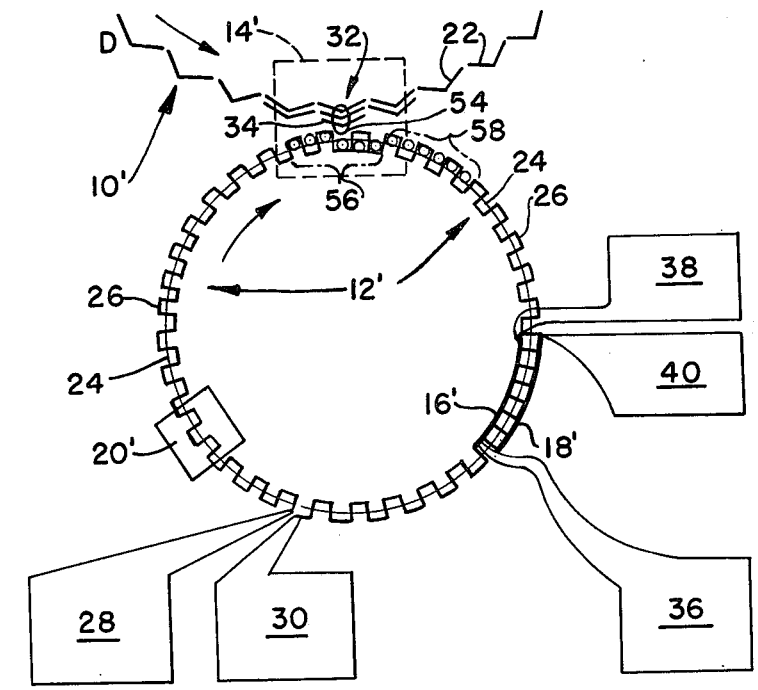
FIG. 2 is a schematic diagram representing a specific embodiment of the system of FIG. 1, employing field-accessed and conductor-driven propagation circuits operating at different frequencies.

FIG. 2 represents an embodiment of the system of FIG. 1. A separate propagation system 10' for the data stream D is provided by a field-accessed chevron channel made up of individual chevron elements 22 laid end-to-end for propagation in the direction of the arrow associated with that channel. Bubbles are propagated down the chevron channel in the ordinary fashion by means of a rotating magnetic drive field (not shown) in the plane of the paper of FIG. 2. The closed propagation circuit 12' is formed by a conductor-driven, "two-rail logic" propagation circuit in the form of a closed loop. The basic principle of operation of this type of circuit is disclosed in U.S. Pat. Nos. 3,636,531 and 3,711,840 to Copeland. These disclosures are incorporated by reference into this application. The conductor-driven circuit 12' includes a magnetically soft rail 24, formed of permalloy, for example, arranged in the form of a closed loop on the surface of a magnetic bubble material (not shown). The width of the rail, in the plane of the loop which it forms, is less than the diameter of the magnetic bubbles. The rail provides stable complementary positions for bubbles on either side of the rail. These bubble positions correspond to binary "1"'s and "0"'s. In the closed loop configuration, for illustration, the bubbles on the inside of the rail 24 correspond to binary "1" and those on the outside of the rail correspond to binary "0." The rail 24 is crisscrossed by a serpentine conductor 26, which defines consecutive stable positions for magnetic bubbles on either side of the rail 24. The adjacent ends of the conductor 26 are connected respectively to terminal pads 28 and 30 adapted to be connected to a source of pulsed control current. Bubbles are driven in unison around the closed path 12' at their respective positions relative to the rail 24, that is, either inside or outside of the rail, by applying current pulses of alternating polarity to the conductor 26 via the terminals 28 and 30; the magnetic attraction provided by the consecutive loops of the conductor 26 causes bubbles to move along the rail from one loop to the next on the same side of the rail.

The rate at which bubbles are propagated along the rail 24 is determined by the frequency of the alternating pulsed current applied to the conductor 26. Similarly, the rate at which bubbles move along the chevron channel 10' is determined by the frequency of the rotating drive field associated with that circuit. Thus, the means of determining the frequency in the two circuits 10' and 12' are separate and independent. The frequency of propagation in the conductor-driven circuit 12' is established at a rate which is preferably an integral multiple of the corresponding frequency of the chevron channel 10'. That is, the frequency of the conductor circuit 12' is $nf$, where the frequency of the chevron circuit 10' is $f$.

The chevron channel 10' is arranged to come close to, or almost tangent to, the perimeter of the conductor-driven circuit 12' at a particular location 32 called the interaction point. At point 32 the width of the chevron channel 10' is increased from the single chevron element 22 to a plurality of closely adjacent elements 32, acting as a bubble expander. The chevron elements on either side of the plurality of elements 34 may also be of increased number. The purpose of widening the chevron track at the interaction point 32 is to increase the size of bubbles propagating down the channel 10' at this point to enhance their magnetic influence on the bubbles in the conductor-driven circuit 12'.

The adjacency of the chevron and conductor circuits 10' and 12' at point 32 allows the data bubbles on the chevron channel 10' to magnetically influence bubbles on the conductor channel 12' arriving at point 32 on the outside of the rail 24 to be switched to the inside of the rail 24. Of course, in the absence of a bubble in the data stream on channel 10', a bubble on the outside of the rail 24 in the conductor circuit 12' would remain on the outside. Thus, a logical interaction takes place.

Downstream on the conductor channel 12' from the point 32, magnetoresistive elements 16' and 18' are arranged on either side of the rail 24 to span a plurality of consecutive bubble positions. Corresponding ends of the elements 16' and 18' are connected in parallel by insulated leads to a terminal pad 36. The other ends of the elements 16' and 18' are connected separately by insulated leads to respective terminal pads 38 and 40. The pads 38 and 40 along with the common pad 36 provide the readout output of the system.

Figure 3:
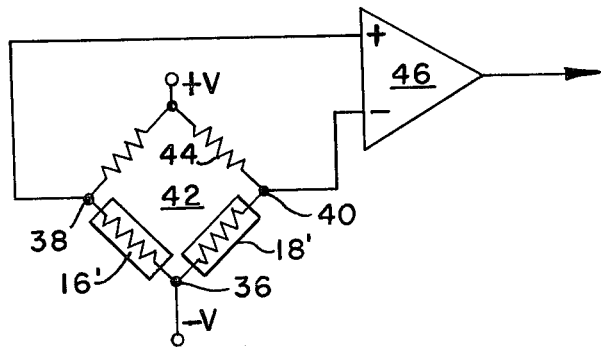
FIG. 3 is a schematic diagram of a bridge circuit employed in connection with the bubble detectors of FIG. 2.

The magnetoresistive elements 16' and 18', as shown in FIG. 3, form a part of a balanced bridge circuit 42 in the nature of a Wheatstone bridge. The elements 16' and 18' are connected in common via terminal pad 36 to a source of voltage of one polarity. The respective other ends of the elements 16' and 18' are connected to corresponding ordinary resistors 44 via terminal pads 38 and 40. The other ends of the resistors 44 are connected in common to a source of voltage of opposite polarity. An unbalanced condition in the bridge circuit 42 is detected by connecting the opposite inputs of a differential amplifier 46 to the terminal pads 38 and 40. In the absence of any magnetic influence upon the magnetoresistive elements 16' and 18', the bridge circuit 42 can be arranged to be in the "balanced" condition wherein there is no potential difference between the terminal pads 38 and 40, and the output of the amplifier 46 is zero. If one of the elements 16' or 18' is magnetically influenced, the output of the amplifier 46 will be positive, and if the other element is magnetically influenced, the output of the amplifier 46 will be negative, thus differentiating between binary "1"'s and "0"'s by the polarity of the differential amplifier output.

Further downstream from the magnetoresistive elements 16' and 18' in FIG. 2, a "reset" circuit 20' is located along the conductor-driven channel 12' upstream of the interaction point 32. The reset circuit 20' acts in an analogous manner to the bubble "OR" gate 20 in the general system diagrammed in FIG. 1. Its purpose is to reconstitute a full stream of bubbles on one "track" (i.e., one side of rail 24) to be influenced by the data stream D. Thus, the reset circuit 20' causes bubbles propagating along the conductor channel 12' on the inside of the rail 24 to be switched consecutively to the outside of the rail. Bubbles which are already on the outside of the rail before passing the reset circuit 20' will remain on the outside of the rail. Consequently, all of the bubbles propagating along the channel 12' will be on the outside of the rail 24 as they approach point 32.

Figure 4:
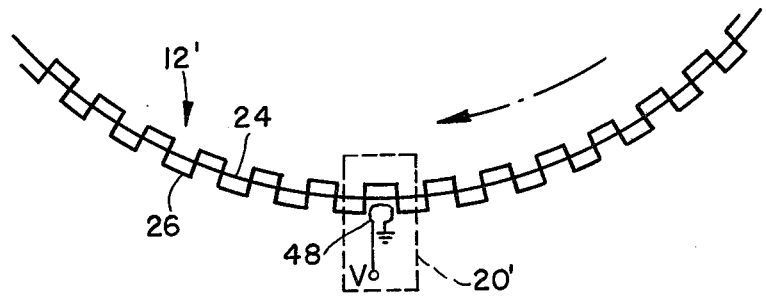
FIGS. 4 through 6 are partial schematic diagrams illustrating respectively three different embodiments of the reset circuit associated with the conductor-driven circuit of FIG. 2.
Figure 5:
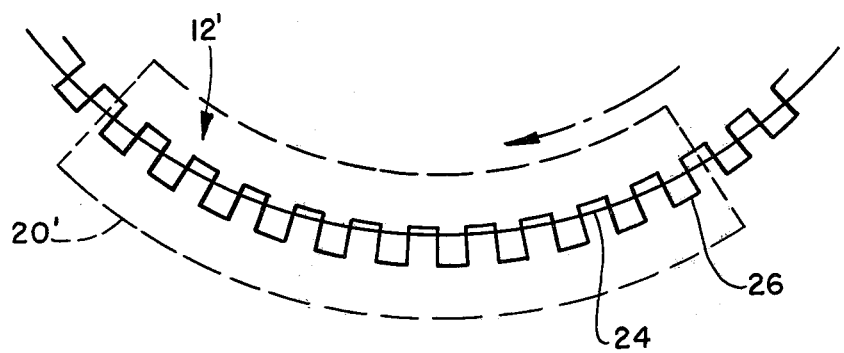
Figure 6:
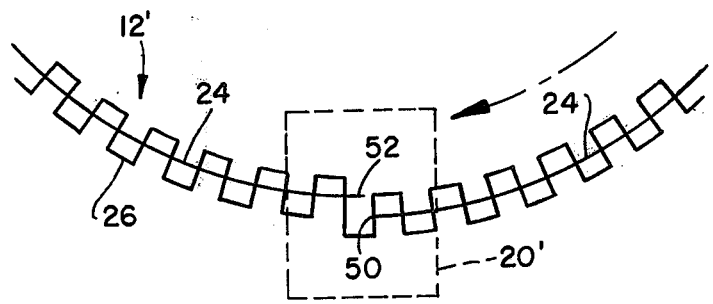

Three different ways in which the reset circuit 20' can be implemented are shown in FIGS. 4, 5 and 6. In FIG. 4, the reset circuit 20' is accomplished by arranging a separate, auxiliary conductor loop 48 adjacent to the outside of the rail 24 between adjacent loops of the serpentine conductor 26. The conductor loop 48 is connected to a source of voltage such that current flowing in the loop 48 magnetically attracts bubbles from the inside to the outside of the rail 24. Bubbles already on the outside rail 24 remain on the outside. The current flowing in the loop 48 remains continuously "ON." Alternatively, the current loop 48 is pulsed at a repetition rate corresponding to the frequency of propagation, $nf$.

In FIG. 5, the auxiliary conductor loop 48 is dispensed with, and instead, the rail 24 is gradually offset toward the inside of the closed loop over a plurality of bubble positions along the channel 12', as shown within the dashed box 20'. Because of the unsymmetrical arrangement of the rail 24 with respect to the serpentine conductor 26, the current pulses in the conductor 26 are of sufficient magnitude to attract the bubbles to the outside of the rail. This switching is accomplished with no change in the pulse amplitude applied to the conductor 26.

In FIG. 6, still another system performing the function of the reset circuit 20' is shown in which a "step discontinuity" in the rail 24 is introduced. The rail 24 is broken at one place and the resulting adjacent ends 50 and 52 of the rail 24 are offset laterally from each other. The serpentine conductor 26, however, is not broken at this point, and remains symmetrical to each of the adjacent portions of the broken rail 24, except of course, at the exact point of the discontinuity. Thus, a bubble travelling down the inside of the rail 24 will always be trapped on the outside of the rail as it passes the discontinuity because of the local energy minimum through which it would have to pass in order to traverse the end portion 52 of the rail 24.

In operation, a full stream of bubbles on the outside of rail 24 in the conductor-driven circuit 12' encounters the magnetic influence of the data stream on chevron channel 10' at the interaction point 32. For every data bit in the data stream D passing location 32, a plurality, $n$, of bubbles on the outside of the rail 24 arrives consecutively at the point 32. For example, in the illustrated case where the frequency multiple $n$ is six, an expanded data bubble 54 is located approximately at the vertex of the multi-chevron element 32 and is in the midst of repelling a "train" of six consecutive bubbles 56 on the conductor-driven circuit 12' toward the inside of rail 24. By the time the slower data bubble 54 has left the interaction point 32, all of the bubbles 56 will have been switched to the inside of the rail 24. In the immediately preceding "bit time", the position occupied by data bubble 54 was vacant, indicating a "0" bit. Thus, the preceding (in time) six bubbles 58 were unaffected, and remained on the outside of the rail.

As the bubbles 58 progress around the closed loop channel 12', they will come under the magnetoresistive element 18'. When all of the bubbles 58 are beneath the element 18', the complementary bit positions under element 16' will all be vacant. The combined magnetic effect of the six bubbles 58 will alter the resistance to the passage of current through the element 18'. This alteration in resistance will be approximately six times greater in magnitude than that which would be experienced if a single data bubble were present under the element 18'. On the other hand, the resistance of the element 16' remains substantially unchanged, due to the absence of bubbles on the inside of rail 24. The resultant unbalance in the bridge circuit 42 in FIG. 3 is sensed as an output from the amplifier 46 of one polarity corresponding to a binary "0," as it will be recalled that the reason why the bubbles 58 remained on the outside track was the absence of a data bubble in the data stream D.

In the subsequent bit time corresponding to bubbles 56 and data bubble 54, the datum is a binary "1." And, accordingly, by the time all six of the bubbles 56 are directly beneath the element 16', there will be no bubbles in the complementary bit positions under the element 18'. Consequently, the bridge 42 in FIG. 3 will be unbalanced in the opposite direction and the polarity of the output of the amplifier 46 will be opposite to indicate a binary "1." As the bubbles 58 continue along the outside of the rail 24 around the lower side (as viewed in FIG. 2) of the closed loop channel 12', they will be unaffected by the reset circuit 20', and remain on the outside of the rail 24 for reintroduction to the interaction point 32 with the data stream. Following on the heels of the bubbles 58, the six bubbles 56 will next encounter the reset circuit 20' which, as described in connection with FIGS. 4, 5 and 6, causes the six bubbles to be consecutively switched to the outside of the rail 24 for subsequent influencing by the data stream D. The bubbles 56 and 58 correspond only to two data bits. It will be understood that all of the bit positions along the closed channel 12' are occupied so that a continuous stream of bubbles is present on the outside of the rail 24 upstream of the interaction point 32.

Instead of operating the conductor-accessed circuit continuously at an integral multiple of the frequency of the field-accessed circuit, the conductor-accessed circuit may be run intermittently at a multiple frequency. During each period of the drive field of the field-accessed circuit, there exists some point in time at which the data bubble reaches a point of maximum influence on the conductor-accessed circuit. For example, in FIG. 2, this point would coincide with the vertices of the multi-chevron element 34. Thus, it would be possible to achieve the same effect as described above by running the conductor-accessed circuit only during that fraction of the drive period of the field-accessed circuit in which a data bubble, present on the latter circuit, is close enough to the conductor-driven circuit to produce the desired logical interaction with the bubbles on the conductor-driven circuit. Thus, the waveform applied to the terminals 28 and 30 of the serpentine conductor 26 in FIG. 2 would be "OFF" for a given portion of the drive field period and "ON" with a frequency $nf$ during a predetermined fraction of the drive field period. This system would eliminate the "fringe effects" which might occur if the system were driven continuously with adjacent bubble trains on the closed conductor-accessed circuit 12'. That is, the leading and trailing bubble of each train might not be very reliably influenced by the data bubble in the continuous system.

The direction of travel of the conductor-driven and field-accessed circuits at the interaction point 32 does not necessarily have to be in the same direction. Running the two circuits in opposite directions is also feasible. It should be noted also that the length of the elements 18' and 16' depends on the multiplication factor, $n$, being used for enhanced readout. Thus, if the frequency of the conductor-accessed circuit 12' were $nf$, the length of the elements 16' and 18' would correspond approximately to $n$ bits, although in practice the lengths of these elements may be slightly more or less than n bubble positions.

Although the widening of the chevron channel 10' at the interaction point 32 indicated in FIG. 2 is preferred, expanding the data bubbles in this manner is not an essential part of the invention, and single chevron elements may be used at this location as well as other field-accessed circuit elements such as Y-bar or T-bar elements known in the art.

It should also be noted that the concept of representing the presences and absences of data bubbles by means of two separate multiplicities of bubbles can be accomplished in an analogous manner by using a bubble multiplying circuit such as that described in reference to FIGS. 27 and 28 in the above-mentioned copending application.

While the invention has been described and illustrated in connection with certain specific embodiments, those schooled in the art will recognize that there are many alternatives, combinations, and variations of the system which fall within the underlying principles and spirit of the invention as indicated in the appended claims.

We claim:

1. A readout system for magnetic bubbles, comprising means for continuously advancing a data stream of magnetic bubbles down a predetermined channel, binary values being indicated by the presences and absences of bubbles at consecutive bubble bit positions in the stream, a pair of complementary readout channels forming a propagation system separate from said data stream, means interacting with said data stream for producing a plurality of bubbles on one readout channel for each "1" bubble bit in said data stream and a complementary plurality of bubbles on the complementary readout channel for each "0" bubble bit in said data stream, a pair of bubble detector means for sensing bubbles on said readout channels respectively, each bubble detector means having means for collectively detecting the presence of said plurality of bubbles on the corresponding readout channel, and readout circuit means interconnected with said bubble detectors for providing an enhanced readout indicative of the binary value of a bubble bit on said data stream.

2. The system of claim 1, wherein said readout channels are provided by a two-rail logic circuit having a pair of closed loop propagation paths.

3. The system of claim 2, wherein said interacting means is arranged to associate said data stream with said closed loop paths such that a bubble on one path is switched to the other path in the presence of a corresponding bubble in said data stream.

4. The system of claim 3, further comprising means for insuring that all bubbles in said two-rail logic circuit are on said one closed path before encountering the influence of said interacting means.

5. The system of claim 4, wherein, said two-rail logic circuit comprises rail means of predetermined width in the form of a closed loop providing complementary stable positions for bubbles on either side of said rail means, the opposite sides of said rail means providing said closed paths, a conductor crisscrossing said rail in uniform consecutive open loops and defining a plurality of consecutive bubble bit positions along said rail, means for propagating bubbles in unison from one bit position to the next down said rail on the same side thereof by pulsing said conductor with alternating current.

6. The readout system of claim 1, wherein said interacting means includes means for receiving a continuously full stream of bubbles as one input and said data stream as another input and for producing said complementary pluralities of bubbles at separate outputs.

7. The readout system of claim 6, further comprising a logical OR gate means operatively receiving the separate outputs of said interacting means for furnishing said full stream of bubbles to said one input of said interacting means.

8. A readout system for magnetic bubbles, comprising a data channel for continuously advancing a data stream of bubbles through a plurality of serial consecutive bubble positions, binary values being represented by the presences and absences of bubbles in said stream, a readout channel including means for continuously advancing bubble bits through a plurality of serial consecutive bubble positions, means for producing on said readout channel a multiplied replica of said data stream in which each bit is reiterated consecutively over a predetermined equal plural number of adjacent bubble bit positions, and readout means operatively connected to said readout channel for collectively sensing the presences of bubbles in a plurality of adjacent bit positions corresponding to said predetermined equal number.

9. A readout system for magnetic bubbles, comprising means for propagating a data stream of bubbles along a predetermined channel in which binary values are indicated by the presences and absences of bubbles, means interacting with said data stream for producing two separate, complementary multiplicities of bubbles corresponding respectively to the presences and absences of bubbles in said data stream, two bubble detectors arranged respectively to sense said two multiplicities of bubbles, and readout circuit means interconnected with said bubble detectors providing an enhanced readout indicative of the binary value of a bubble bit in said data stream, said means for producing said multiplicities of bubbles including a logical interactor operatively receiving said data channel as an input thereto, a separate propagation system for furnishing a full stream of bubbles as another input to said logical interactor, said logical interactor producing a pair of complementary outputs forming part of said separate propagation system and containing respectively said multiplicities of bubbles, and means for operating said separate propagation system at a multiple of the frequency of said data stream.

10. The system of claim 9, wherein said data channel includes field-accessed circuit elements and said separate propagation system includes conductor-driven circuit elements.

11. The system of claim 10, wherein said separate propagation system includes a two-rail logic propagation circiut.

12. The system of claim 11, wherein said two-rail logic propagation system includes a closed loop propagation channel including a rail of predetermined width in the form of a closed loop providing stable bubble positions on the inside and the outside of said rail, conductor means crisscrossing said rail to define consecutive bit positions along said rail, and means for applying alternating current to said conductor means to move bubbles on the inside or on the outside of said rail along said rail in unison through consecutive bit positions.

13. The system of claim 12, wherein said two-rail propagation system further includes reset circuit means located at a predetermined position along said rail for continuously returning bubbles to the outside of said rail, said logical interactor being provided by the adjacency of said field-accessed circuit and said two-rail logic circuit at an interaction point downstream from said reset circuit means.

14. The system of claim 13, wherein said bubble detectors include separate, elongated magnetoresponsive elements arranged to be influenced simultaneously by a plurality of consecutive bubbles on corresponding sides of said rail at complementary bit positions.

15. The system of claim 14, wherein said magneto-responsive elements each comprise magnetoresistive elements, and said readout circuit means includes a bridge circuit incorporating said magnetoresistive elements.

16. The system of claim 15, wherein said bridge circuit includes a balanced Wheatstone bridge-type circuit in which said magnetoresistive elements form two resistance arms thereof, and electrical detector means connected to opposite junctions of said bridge for indicating the polarity of unbalance of said bridge circuit.

17. A magnetic bubble circuit, comprising two magnetic bubble propagation circuits each having means for advancing bubble bits down a channel through a plurality of serial consecutive bubble positions at a constant data rate, means for determining different simultaneous constant data rates for said two circuits respectively, and interaction means for causing bubbles on one of said circuits to be logically influenced by means of magnetic repulsion by the presences of bubbles in said other circuits while said circuits are both running at said different constant data rates.

18. A magnetic bubble circuit, comprising a field-accessed magnetic bubble propagation circuit and a conductor-driven magnetic bubble propagation circuit, interactor means for logically influencing one of said circuits with the other, and means for operating said circuits simultaneously at different frequencies, respectively.

19. The system of claim 18, wherein said conductor-driven circuit includes a rail providing stable locations for magnetic bubbles on either side thereof and a conductor crisscrossing said rail defining consecutive, complementary bit positions along said rail on either side thereof and means for applying alternating current to said conductor to move bubbles on either side of said rail in unison through said consecutive bit positions.

20. The system of claim 19, wherein said conductor-driven circuit forms a closed loop.

21. The system of claim 19, wherein said field-accessed circuit is composed of chevron elements.

22. A conductor-driven, two-rail logic, magnetic bubble propagation circuit, comprising a rail of predetermined width, providing complementary stable positions for bubbles on either side thereof, a conductor crisscrossing said rail in consecutive, uniform open loops and defining a plurality of consecutive bit positions along said rail, circuit means for propagating bubbles in unison from one bit position to the next down said rail on the same side thereof by pulsing said conductor with alternating current, a step discontinuity being provided in said rail, the adjacent ends of said rail formed by said discontinuity being offset laterally from each other such that a single side of said rail beyond said discontinuity is preferred by bubbles approaching said discontinuity from either side of said rail.

23. A readout system for magnetic bubbles, comprising a data channel for propagating a data stream of bubbles in which binary values are represented by the presences and absences of bubbles in said stream, a readout channel, means for operating said readout channel at a multiple of the frequency of said data channel, means for producing on said readout channel a modified replica of said data stream in which each bit is reiterated consecutively over a predetermined equal number of bit positions, and readout means operatively connected to said readout channel for collectively sensing the presences of bubbles in a plurality of bit positions corresponding to said predetermined equal number.

24. A conductor-driven, two-rail logic, magnetic bubble propagation circuit, comprising a rail of predetermined width providing complementary stable positions for bubbles on either side thereof, a conductor crisscrossing said rail in uniform, consecutive, open loops and defining a plurality of consecutive bubble bit positions along said rail, means for propagating bubbles in unison from one bit position to the next down said rail on the same side thereof by pulsing said conductor with alternating current, the excursion of said conductor loops normally being approximately symmetrical with respect to said rail, said rail being offset laterally toward one side of said crisscrossing conductor over a selected plurality of consecutive bit positions, whereby bubbles on one side or the other of said rail are forced to the other side of said rail as they pass through said selected bit positions.

25. A readout system for magnetic bubbles, including a data channel for propagating a data stream of magnetic bubbles in which binary values are represented by the presences and absences of consecutive bubbles in said stream, a readout channel and means operatively interconnecting said data channel and said readout channel for producing on said readout channel a stream of bubbles indicative of the presences and absences of bubbles in said data stream at a rate which is a multiple of the frequency of propagation of said data channel.

26. A readout system for magnetic bubbles, comprising means defining a first channel with consecutive bubble bit positions for propagating a serial data stream of bubbles in which binary values are indicated by the presences and absences of bubbles at consecutive positions, means defining a second channel with consecutive bubble bit positions for propagating a serial readout stream of bubbles in which binary values are indicated by the presences and absences of bubbles at consecutive positions, means interacting with said data stream for causing said readout stream on said second channel to become a multiplied replica of said data stream in which each bit is reiterated over a number of consecutive bubble bit positions, and readout means for collectively sensing the presences of bubbles in a plurality of consecutive bit positions on said second channel.

27. The system of claim 26, wherein said second channel forms a closed loop for recirculating said readout stream.

28. The system of claim 26, further comprising means defining a third channel with consecutive bubble bit positions for propagating a serial readout stream of bubbles in which binary values are represented by the presences and absences of bubbles at consecutive positions, said means interacting with said data stream further causing said readout stream on said third channel to become the logic complement of the readout stream on said second channel, and another readout means for collectively sensing the presences of bubbles in a plurality of consecutive bit positions on said third channel.

29. The system of claim 28, wherein each of said second and third channels forms a closed loop for recirculating bubbles.

30. The system of claim 28, further comprising circuit means interconnected with said two readout means for discriminating between binary values.

* * * * *